April 15, 1969 A. HERLET ET AL 3,439,239

SEMICONDUCTOR RECTIFIER DIODE FOR POWER CURRENT WITH A PARTICULAR DOPING

Filed June 14, 1966

United States Patent Office 3,439,239

Patented Apr. 15, 1969

3,439,239

SEMICONDUCTOR RECTIFIER DIODE FOR POWER CURRENT WITH A PARTICULAR DOPING

Adolf Herlet, Pretzfeld, and Hubert Patalong, Ebermannstadt, Germany, assignors to Siemens Aktiengesellschaft, Erlangen, Germany Filed June 14, 1966, Ser. No. 557,515

Claims priority, application Germany, June 15, 1965, S 97,625

Int. Cl. H01l *11/06, 15/00;* H03k *19/08*

U.S. Cl. 317—235 5 Claims

ABSTRACT OF THE DISCLOSURE

The invention concerns a semiconductor power rectifier with a monocrystalline, flat silicon body, having a first outer layer of a given conductivity type and a second outer layer of opposite conductivity type, both layers having doping concentrations higher than $10^{17}$/cm.$^3$. Two inside layers with lower doping concentrations are between said outer layers, one first inside layer of the same conductivity type as its adjacent outer layer and a second inside layer of the same conductivity type as its adjacent outer layer and with a p-n junction between the two inside layers. The invention is characterized by the fact that the first inside layer is almost uniformly doped with a doping concentration of $3\times10^{13}$ to $10^{14}$ atoms/cm.$^3$, the second inside layer is 30 to 70$\mu$ thick with a doping concentration which rises almost exponential from the p-n junction to the outside, in such a way that in a distance of from 7 to 13$\mu$ from the p-n junction to the outer layer, the doping concentration increases by $e$ or 2.7. This affords an improved mode of operation and increases the operational safety, that is the allowed voltage applied, insofar as it may reduce the danger to the rectifier diode caused by a local increase in steepness of the backward current, due to excessive voltage in backward direction which occurs, for example, during an avalanche breakthrough.

This invention concerns a semiconductor power rectifier with a monocrystalline, flat silicon body, having a first outer layer of a given conductivity type and a second outer layer of opposite conductivity type, both layers having doping concentrations higher than $10^{17}$ cm.$^{-3}$. Two inside layers with lower doping concentrations are between said outer layers, one first inside layer of the same conductivity type as its adjacent outer layer and a second inside layer of the same conductivity type as its adjacent outer layer and with a p-n junction between the two inside layers. The invention is characterized by the fact that the first inside layer is almost uniformly doped and by several powers of ten less highly doped than the adjacent outer layer and that in the second inside layer, the doping concentration in the vicinity of the p-n junction, is lower by several, particularly one to four powers of ten, than in the vicinity of its adjacent outer layer. This affords an improved mode of operation and increases the operational safety, that is the allowed voltage applied insofar as it may reduce the danger to the rectifier cell caused by a local increase in steepness of the backward current, due to excessive voltage in backward direction which occurs, for example, during an avalanche breakthrough. Thus in the event of an avalanche breakthrough, the breakthrough extends over the entire semiconductor cross section which is available for an increased backward current. The current is distributed in the most possible uniform way over the entire surface of this cross section. This mostly uniform area stress increases the current load capacity in the blocking direction. According to a further feature of the invention, this goal is approached particularly closely by the fact that the doping concentration of the outer layer, adjacent to the p-n junction, first shows an exponentially increasing curve at an increased distance from the p-n junction. Further improvements are achieved through the following measures and features such as determination of a specific concentration profile of the firstly observed layer; selection of a specific resistance value and measuring the thicknesses of the various layers of the semiconductor bodies, or of their partial sections. The indicated dimensions may thereby be so adjusted to each other that optimum forward and backward values are obtained. More details will be derived and disclosed in an embodiment example which is schematically illustrated in the drawing and in diagrams belonging thereto.

Figure 1:
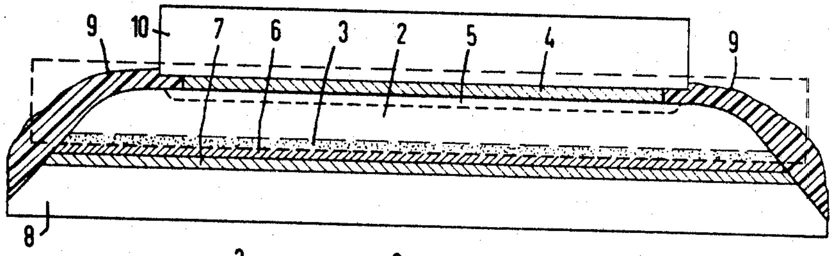
FIG. 1 is the cross section profile of a rectifier cell.

In FIG. 1, 2 indicates the uniformly doped core, which remained unchanged, of an n-conducting, disc-shaped silicon monocrystal with a specific resistance between 50 and 150 ohm cm., whose original cross section is indicated by the dashed supplementary lines. The conductance characteristic of a 60 to 100$\mu$ thick layer 3 was converted into p-type by an overall indiffusion of acceptors, preferably aluminum and possibly gallium, according to known technique, so that after this diffused p-layer was lapped off on one planar side and the edge of the semiconductor disc was removed by sand blasting and/or etching, a p-n structure emerges. However, the acceptors may also be in diffused only on one side into a silicon disc, which is thinner by one thickness of the p-layer, and this is done according to the known photo-resist technique. In such an event, the lapping off is superfluous after the diffusion process. The lapping off is also unnecessary, if by means of epitaxy, monocrystalline silicon is precipitated on one side of a disc-shaped monocrystalline silicon core 2 of n-type. This thickens the silicon core and the layer. Methods which make possible, for instance, depositing silicon through pyrolytic dissociation of a gaseous silicon compound, for example, $SiHCl_3$ or $SiCl_4$, under co-action of a carrier and reaction-gas $H_2$, or the monocrystalline depositing of silicon, by means of vaporing or cathodic sputtering and simultaneous partial removal of precipitated silicon, can produce any desired curve of concentration quantities across the disc thickness by an intentional change in the supplemented amounts of doping material during the process.

An outer layer of the embodiment illustrated in FIG. 1, is produced through alloying in of an acceptor-containing metal, preferably aluminum. For example, the silicon disc, with an aluminum foil placed upon it, and covering the entire front face, is heated above the eutectic temperature. Subsequently upon cooling, a highly doped p-conducting recrystallization layer 6 results. This is covered by layer 7, which serves as a contact electrode and which consists of an aluminum-silicon-eutectic. Preferably, in one and the same operational step, with the aforementioned alloying process, a molybdenum disc 8, extending above the edge of the silicon disc, is alloyed onto the contact electrode 7. The molybdenum disc may be coated with an aluminum layer which was previously applied by electrolysis and annealed by heating to about 900° C.

A highly doped n-conducting outer layer 5, which occupies only a partial region of the semiconductor area, is produced by appropriate alloying in of a donor-containing metal on the n-conducting side of the silicon disc which has been exposed through the lapping off process. It is favorable to use a gold foil containing about 1% antimony in connection with the above process. This shape and thickness of the gold-silicon alloy which solidifies upon cooling below the eutectic temperature after the gold foil is alloyed in are determined by its original shape and thickness. The gold foil may be in the shape of a circular area whose diameter is about 4 mm. smaller than the diameter of the n-conducting silicon core. The recrystallization layer 5 and the contact electrode 4 of the gold-silicon alloy, therefore have a round shape and are enclosed by about a 2 mm. wide ring of the originally n-conducting silicon. The gold foil is to be about 90$\mu$ thick. A molybdenum disc 10 is applied at the contact electrode 4, for example, by pressure contact, soldering or alloying. The disc extends sideways a maximum of 1 mm., and preferably 0.2 to 0.5 mm. over the contact electrode. In this way, the entire gold electrode would be covered but still be at a large enough distance from the outer edge of the p-n junction, so that voltage short circuits can be avoided. The edge of the silicon disc is protected by a varnish coating 9, preferably alizarine lacquer.

Figures 2, 3:
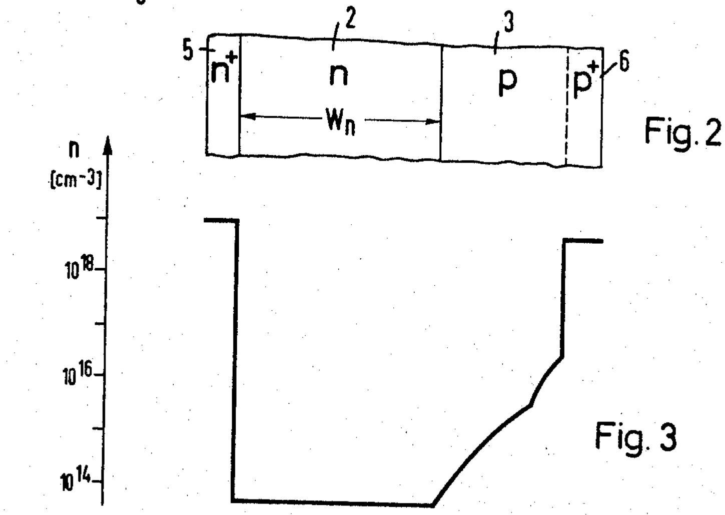
FIG. 2 illustrates the sequence of the semiconductor layers in the plane of a section, through the axis of a semiconductor element.
FIG. 3 shows the course of the doping concentration in the individual layers. It is assumed in these drawings, that the uniformly doped layer is of *n*-conducting type.

Essential for the blocking capacity of the p-n junction, is the selection of the gradient of doping concentration in the adjacent p-doped inner layer. This gradient is, among other things, decisive for the magnitude of the breakdown voltage. At a given value of the specific resistance, for example, in an n-conducting inner layer, the higher the breakdown voltage, the flatter is the doping gradient in the adjacent portion of the p-conducting region. An additional, preferred embodiment lies therefore, in the fact, that the doping concentration in the p-conducting inside layer in the vicinity of the p-n junction, rises exponentially at an increased distance from the latter, whereby the initial value may be approximately equal to the concentration value in the n-conducting inside layer. Good results were achieved with a curve, wherein the distance of the path $\tau$ across which the doping concentration increases by the factor $e=2.7$, is from 7 to 13$\mu$, and preferably 10$\mu$. In order to prevent the thickness of the p-conducting inner layer, which is necessary for increasing the doping concentration to the desired value, from becoming too great and consequently increasing the forward voltage at an undesirable rate, the rising of the doping concentration in the p-conducting inner layer may be steeper at a larger distance from the p-n junction, than after the above-mentioned exponential function. It is thus possible to combine a relatively flat gradient in the vicinity of the p-n junction with a relatively small layer thickness. It is possible to produce this concentration curve, which is steeper toward the outside, by the diffusion method even if dependent upon the natural laws of diffusion, contrary to the depositing process, whereby any desired concentration profile may be obtained. The concentration curve may be influenced by an appropriate variation of the diffusion parameters and through the use of several doping materials with differing diffusion constants. As the embodiment in FIG. 3 shows, the desired concentration profile is obtained in the p-conducting inside layer through an appropriate selection of the diffusion parameters and through the in-diffusion of gallium and aluminum. The aluminum determines the concentration curve in the vicinity of the p-n junction, the gallium in the region of the steeper rise.

Additional improvement possibilities are derived from the selection of the concentration values in the outer regions of the example, through alloying with aluminum or gold-antimony. In forward state, these serve as source regions, from which the inside layers, positioned inbetween, are flooded with current carriers of both polarities. Therefore, too low doping concentrations in the mentioned source regions would lead to inadequate flooding, and an additional result stemming therefrom would be an undesirably high forward voltage. For this reason, the doping concentration in the outer layers is favorably chosen higher than $10^{17}$, for example, $10^{18}$ to $10^{19}$ atoms/cm.$^3$. To produce the high concentration values in the two outer regions, the known alloying methods are particularly suitable, and were, therefore, used in the specific example, as mentioned above.

The high doping of the above-mentioned source regions is not sufficient by itself to provide an adequately low forward voltage, but rather the current carriers must be in a position, thanks to their diffusion length, to flood almost uniformly, the entire middle region between the two source regions. This may be achieved, if the thickness value of the middle region is less than four times, but preferably about equal to double the diffusion length L at high injections, corresponding to a current density of about 10 to 200 A./cm.$^2$. Greater thickness would result in undesirably high values of the forward voltage, while slighter thickness would markedly reduce the barrier capacity, since either the thickness of the p-layer would have to be reduced, i.e. a steeper concentration gradient would have to be selected in the vicinity of the p-n junction or else the thickness of the n-layer would have to be chosen too small. However, the latter is important for the obtainable barrier capacity, which can be seen in FIG. 4.

Figure 4:
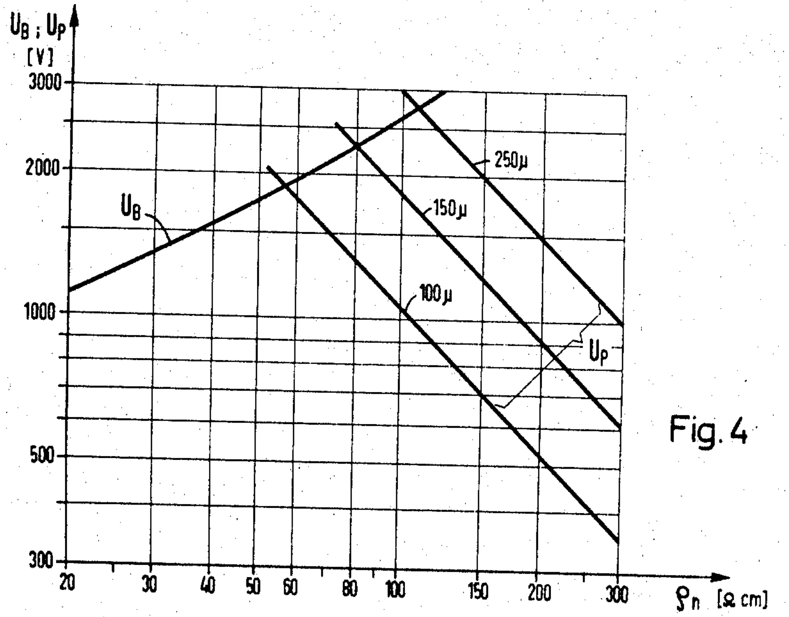
FIG. 4 shows experimentally and mathematically established characteristic magnitudes for the maximum blocking capacity of the semiconductor rectifier cell, depending on the specific resistance of the *n*-conducting middle layer.

FIG. 4 shows the breakdown voltage of a diffused p-n junction dependent upon the specific resistance of the used n-conducting silicon. This curve applies for the diffusion profile of the above-described gallium alluminum diffusion, wherein the p-n junction is about 60 to 100$\mu$ below the silicon surface. Furthermore, the punch-through voltages are shown for various thicknesses of the n-conducting inner layer, which when applied in barrier direction cause the space charge regions to be adjacent to the alloying faces. The blocking or barrier capacity of rectifiers is not limited by the punch-through voltages if the alloyed junction between the weakly n-conducting inside layer and the alloyed n-layer is perfect. However, if the rectifier can be dimensioned in a way whereby "punch-through" is avoided, there is no dependence on the quality of this alloyed junction. Then the barrier characteristics of the rectifier are determined only by a p-n junction of the described type, with a subsequent flat and exponentially rising curve of doping concentration.

This type of p-n junction helps to obtain a high pulse overloading capacity in barrier direction, which is even more complete, as seen from FIG. 4, if the specific resistance of the weakly doped n-conducting inside layer is as uniform as possible, across the entire cross section, since an avalanche breakthrough would occur at an increased voltage, first at a locality of the cross section which has a particularly low value of specific resistance. Therefore, the starting material is preferably a silicon in which local deviations in specific resistance, amounts to less than 10% of the cross section value of the respective cross section.

As can also be seen from FIG. 4, the barrier capacity is higher with larger thicknesses $W_n$ of the n-conducting inside layer. However, it is of little advantage to exceed 250$\mu$, since otherwise the thickness of the middle region, which is flooded by current carriers during the passage of current in forward direction, would not at high injections exceed a quadruple of the diffusion length L.

As previously disclosed, the thickness of the diffused inside layer amounts to approximately 60 to 100$\mu$. This thickness is necessary for a flat diffusion profile. About 30$\mu$ of this layer is used up and recrystallized through the alloying in of acceptor-containing material, for example, aluminum foil. Since in diffused p-n junctions, the space charge regions extend also into the diffused region, the distance of the alloying face from the diffused p-n junction should amount, if possible, to 30–70$\mu$, in order to preclude the possibility that irregularities in the alloying front would impair the barrier characteristics. If a total thickness of about 320$\mu$ between the alloying fronts of the source regions is not to be exceeded for the aforementioned reasons, a thickness $W_n$ of 150 to 250$\mu$ remains for the weakly doped n-layer. As seen from FIG. 4, a specific resistance of the n-conducting core of 50 to 150 ohm cm. is particularly favorable with the above-mentioned thicknesses, in order to obtain a high barrier capacity at larger layer thickness and higher specific resistance, and also increase somewhat the forward voltage.

Maximum barrier voltages of the rectifier amounting to more than 2000 v. may be obtained in the above-described manner. Since the layer thickness, as well as the doping concentration, are so dimensioned that the space charge region abuts neither against the alloying boundary on the aluminum side nor against the alloying boundary on the gold-antimony side, a specific blocking capacity may be definitely determined by the p-n junction, produced by diffusion. On the other hand, imperfections of the allowing boundaries cannot impair the barrier capacity. Therefore, during production, one obtains a large yield of good rectifiers.

The use of two molybdenum discs, each of which covers the entire effective electrode surface, not only assures a good heat removal during continuous operation, toward any desired side, even both sides, but also considerably remedies short-term overheating through pulse stresses, particularly those occurring in blocking direction, by utilizing the heating capacity of the molybdenum discs.

The embodiment example is described largely under the assumption that the core of the layer sequence is formed by an n-conducting inside layer, which is doped uniformly and lower than all the remaining layers, and which is bordered on one side by a p-conducting inside layer, whose doping concentration increases at an increased distance from the core layer, and by a highly doped outer layer of respectively equal conductance type which is adjacent to each inside layer. In the event that conductivity p- and n-types are interchanged, the defining values of the rectifier cell may be selected according to the same rules, and adjusted to each other in the described manner, taking into consideration the known material constants.

The features derived from the above disclosure and/or from the accompanying drawing, as well as the operational processes and instructions, insofar as not previously known, are to be regarded individually as well as in the combination discosed here for the first time, as valuable, inventive improvements.

We claim:

1. Semiconductor rectifier diode for power current with a monocrystalline, flat silicon body, having a first outer layer of a given conductivity type and a second outer layer of opposite conductivity, both layers having doping concentrations higher than $10^{17}$ atoms/cm.$^3$; two inner layers with lower doping concentrations between said outer layers, one first inside layer of the same conductance type as its adjacent outer layer and a second inside layer of the same conductivity as its adjacent second outer layer and a p-n junction between both inside layers, said first inside layer is 150 to 250$\mu$ thick, is substantially uniformly doped with a doping concentration of $3\times10^{13}$ to $10^{14}$ atoms/cm.$^3$, the second inside layer is 30 to 70$\mu$ thick with a doping concentration which rises almost exponential from the p-n junction to the outside, in such a way that in a distance of from 7 to 13$\mu$ from the p-n junction to the outer layer, the doping concentration increases by *e* or 2.7.

2. The semiconductor diode of claim 1, wherein the resistance of the first inside layer does not deviate locally by more than $\pm10\%$ of its average resistance value, across its area, perpendicularly to its thickness.

3. The semiconductor diode of claim 1, wherein the distance length across which the doping concentration rises is 10$\mu$.

4. The semiconductor diode of claim 1, wherein the diffusion length L is at high injection at least one-fourth of the combined two inside layers.

5. The semiconductor diode of claim 1, wherein the second inside layer in the vicinity of the p-n junction, contains aluminum as a doping substance.

References Cited

UNITED STATES PATENTS

| | | | |
|---|---|---|---|
| 3,316,465 | 4/1967 | Von Bermuth | 317—234 |
| 3,323,955 | 6/1967 | Jochems | 148—177 |
| 3,231,796 | 1/1966 | Shombert | 317—235 |

JOHN W. HUCKERT, *Primary Examiner.*

M. EDLOW, *Assistant Examiner.*

U.S. Cl. X.R.

307—305